United States Patent [19]
Oh

[11] Patent Number: 6,150,206
[45] Date of Patent: *Nov. 21, 2000

[54] METHODS OF FORMING INTEGRATED CIRCUIT CAPACITORS USING TRENCH ISOLATION AND PLANARIZATION TECHNIQUES

[75] Inventor: Hee-Seon Oh, Kyungki-do, Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/996,558

[22] Filed: Dec. 23, 1997

[30] Foreign Application Priority Data

Apr. 29, 1997 [KR] Rep. of Korea ................... 97-16044

[51] Int. Cl.[7] ................ H01L 21/8234; H01L 21/8244
[52] U.S. Cl. ................ 438/238; 438/239; 438/381; 438/386; 438/692
[58] Field of Search ................ 438/238, 239, 438/381, 386, 391, 692

[56] References Cited

U.S. PATENT DOCUMENTS

| | | | |
|---|---|---|---|
| 5,275,974 | 1/1994 | Ellul et al. | 438/386 |
| 5,629,539 | 5/1997 | Aoki et al. | 257/306 |
| 5,674,787 | 10/1997 | Zhao et al. | 438/627 |
| 5,879,985 | 3/1999 | Gambino et al. | 438/253 |

*Primary Examiner*—Carl Whitehead, Jr.
*Assistant Examiner*—Maria Guerrero
*Attorney, Agent, or Firm*—Myers Bigel Sibley & Sajovec

[57] ABSTRACT

Methods of forming integrated circuit capacitors include the steps of forming a trench in a first electrically insulating layer and then forming a first electrically conductive layer on a sidewall and bottom of the trench. A dielectric layer is then formed on the first electrically conductive layer. Next, a second electrically conductive layer is formed on the dielectric layer, opposite the first electrically conductive layer. A step is then performed to planarize the first and second electrically conductive layers to define first and second electrodes of a capacitor in the trench. In particular, the step of planarizing the first electrically conductive layer comprises planarizing the first electrically conductive layer to define a first electrode having a U-shaped cross-section. This step results in the formation of a first electrode having a relatively large effective area (which is a function of the depth of the trench) for a given lateral dimension.

14 Claims, 13 Drawing Sheets

METHODS OF FORMING INTEGRATED CIRCUIT CAPACITORS USING TRENCH ISOLATION AND PLANARIZATION TECHNIQUES

FIELD OF THE INVENTION

The present invention relates to methods of forming integrated circuits, and more particularly to methods of forming capacitors for integrated circuits.

BACKGROUND OF THE INVENTION

Capacitors having improved high frequency characteristics and large capacity have been in demand to perform an increased number of functions in semiconductor integrated circuits. To achieve high-speed capacitors, the frequency dependency thereof should be decreased by reducing the resistance of the electrodes therein. Moreover, to achieve large-capacity capacitors, the thickness of an insulating layer interposed between the capacitor electrodes should be reduced, the dielectric constant of the insulating layer should be large and/or the area of the capacitor electrodes should be increased.

Capacitors used in semiconductor devices may have the structure of a metal oxide semiconductor (MOS) type, PN junction type, polysilicon-insulator-polysilicon (PIP) type, metal-insulator-metal (MIM) type, etc. Unfortunately, the above capacitor structures (excepting the MIM type structure) may be limited in high frequency performance because it is typically difficult to reduce the resistance of semiconductor electrodes to levels comparable to other conductive materials such as metals.

Accordingly, in semiconductor devices requiring high-speed capacitors, thin film capacitors having the MIM type structure can be used to provide low-resistance capacitor electrodes. In particular, a thin film capacitor of the MIM type structure has been widely applied to precise analog semiconductor devices since its capacitance variation (due to a voltage or temperature change) is typically very small. To facilitate capacitor formation, multilayer-wiring processes have been developed to achieve high integration levels, and thus the manufacturing processes of the thin film capacitor having the MIM type structure typically use a multilayer-wiring process.

FIGS. 1a to 1i are views explaining a conventional method of fabricating a MIM-type thin film capacitor using a multilayer-wiring process. Referring to FIG. 1a, in the multilayer-wiring process, a first insulating layer 10 is formed to insulate a lower structure (not shown) which has already been formed on an active region of a semiconductor substrate. Thereafter, an aluminum layer 12 is deposited on the first insulating layer 10 to form a first wiring layer. Referring to FIGS. 1b and 1c, a photoresist pattern 14 is formed on the aluminum layer 12, and then the aluminum layer 12 is selectively removed by a photographic and etching process to form a lower capacitor electrode 12a.

Thereafter, referring to FIG. 1d, a second insulating layer 16 is formed on upper surfaces of the lower capacitor electrode 12a to insulate the first wiring layer from a second wiring layer to be formed during subsequent steps. Referring now to FIGS. 1e and 1f, a photoresist pattern 18 is formed on the second insulating layer 16, and then the second insulating layer 16 is selectively removed by a photographic and etching process to form a contact hole 20. Thereafter, referring to FIGS. 1g and 1h, an oxide layer is formed (e.g., deposited) on the surface of the second insulating layer 16 and the lower capacitor electrode 12a, to form a dielectric layer 22, and an aluminum layer is deposited on the dielectric layer 22 to form the second wiring layer. Thereafter, the aluminum layer is selectively removed by a photographic and etching process as shown in FIG. 1i, so that an upper capacitor electrode 24 is formed.

In forming the lower capacitor electrode 12a, the surface of the dielectric layer 22 formed on the lower capacitor electrode 12a is apt to become uneven or in the worst case, portions of the dielectric layer 22 formed on the edge portions of the contact hole may be cut off as shown in FIG. 2 because of overetching during the etching process for forming the contact hole. If this unevenness is present in the dielectric layer 22, the lower and upper capacitor electrodes 12a and 24 may become short circuited together.

Japanese Laid-Open Patent Application No. 5-299582 discloses the use of an oxide layer having a thickness of about 1300Å as the dielectric layer to solve the short-circuit problem between the upper and lower capacitor electrodes. However, according to this conventional method, only thin film capacitors having very small capacitance of about 0.28fF/$\mu$m can be obtained due to the increase in the dielectric layer's thickness, and thus the size of the semiconductor device should be increased to obtain a desired capacitance. Meanwhile, in the event the lower capacitor electrode is formed with an aluminum-series layer as described above, the dielectric layer to be formed on the lower capacitor electrode typically cannot be processed under a temperature of more than about 450° C. due to the relatively inferior thermal characteristics of aluminum. This limitation may cause the quality of the dielectric layer to be reduced.

As described above, the conventional method of fabricating a thin film capacitor has drawbacks in that it cannot be easily applied to semiconductor devices which require high-speed and large-capacity capacitors. Thus, notwithstanding the above described process, there continues to be a need for improved methods of forming capacitors with high capacitance.

SUMMARY OF THE INVENTION

It is therefore an object of the present invention to provide improved methods of forming integrated circuit capacitors.

It is another object of the present invention to provide methods of forming integrated circuit capacitors with high capacitance.

It is still another object of the present invention to provide methods of forming integrated circuit capacitors having reduced lateral dimensions.

These and other objects, advantages and features of the present invention are provided by methods of forming integrated circuit capacitors which include the steps of forming a trench in a first electrically insulating layer and then forming a first electrically conductive layer on a sidewall and bottom of the trench. A dielectric layer is then formed on the first electrically conductive layer. Next, a second electrically conductive layer is formed on the dielectric layer, opposite the first electrically conductive layer. A step is then performed to planarize the first and second electrically conductive layers to define first and second electrodes of a capacitor in the trench. In particular, the step of planarizing the first electrically conductive layer comprises planarizing the first electrically conductive layer to define a first electrode having a U-shaped cross-section. This step results in the formation of a first electrode having a relatively large effective area (which is a function of the depth of the trench) for a given lateral dimension.

According to a preferred embodiment of the present invention, the step of forming the first electrically conductive layer comprises forming a first electrically conductive layer on an upper surface of the first electrically insulating layer. In addition, the planarizing step includes planarizing the first and second electrically conductive layers simultaneously to expose the first electrically conductive layer. The step of forming a trench may also be preceded by the steps of forming a first electrically insulating layer on a face of a semiconductor substrate and forming a contact hole in the first electrically insulating layer to expose the face of the semiconductor substrate. Alternatively, the contact hole may be formed after the trench is formed. The step of forming the first electrically conductive layer also preferably includes forming a firsts electrically conductive layer in the contact hole.

DESCRIPTION OF PREFERRED EMBODIMENTS

Figure 1A:
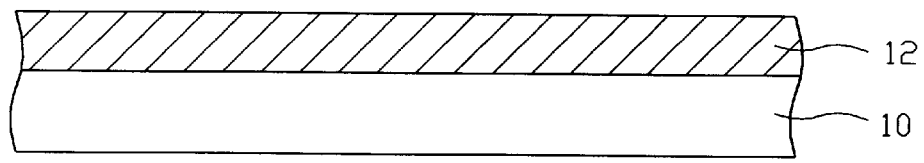
FIGS. 1a–1i are cross-sectional views of intermediate structures that illustrate a method of forming an integrated circuit capacitor according to the prior art.
Figure 1B:
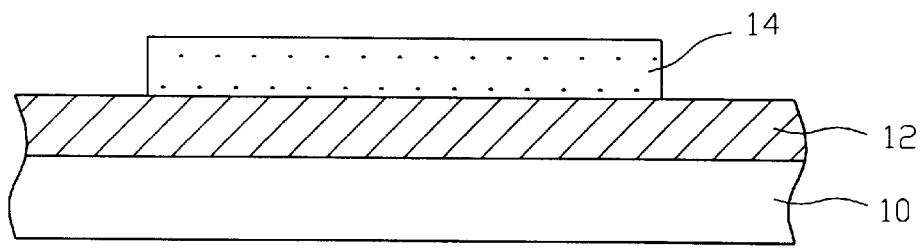
Figure 1C:
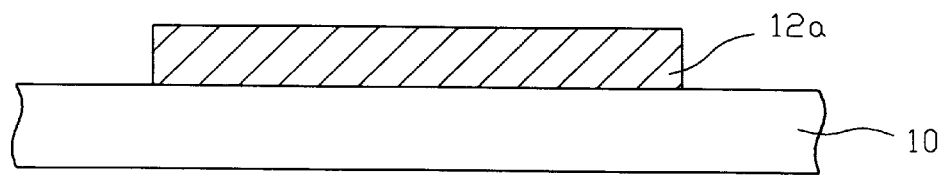
Figure 1D:
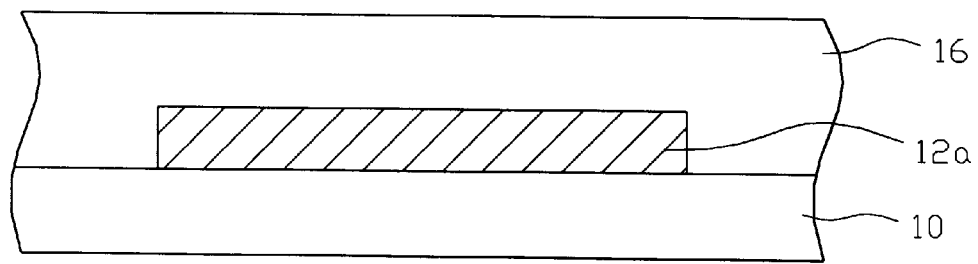
Figure 1E:
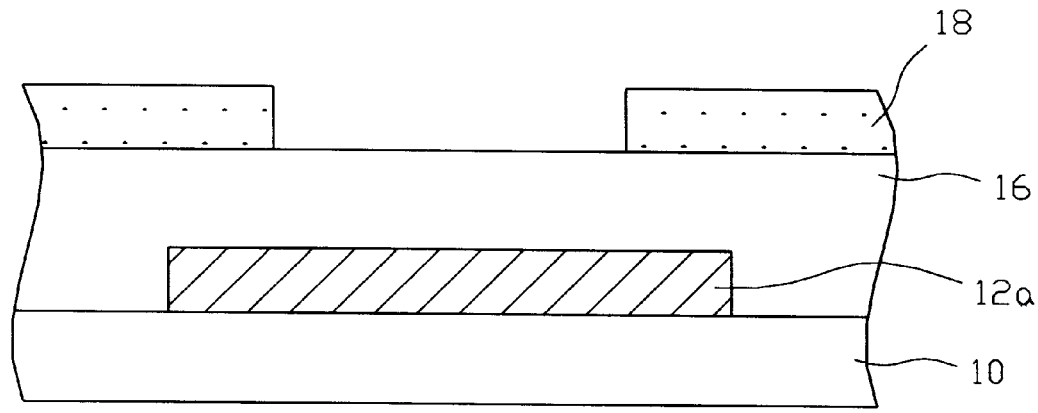
Figure 1F:
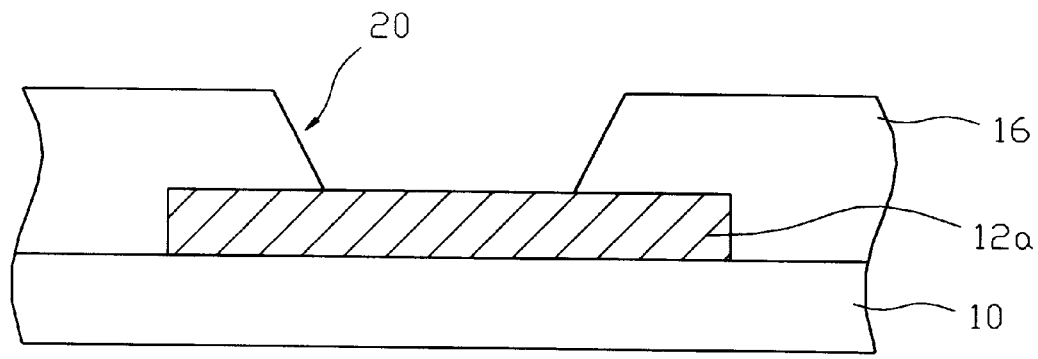
Figure 1G:
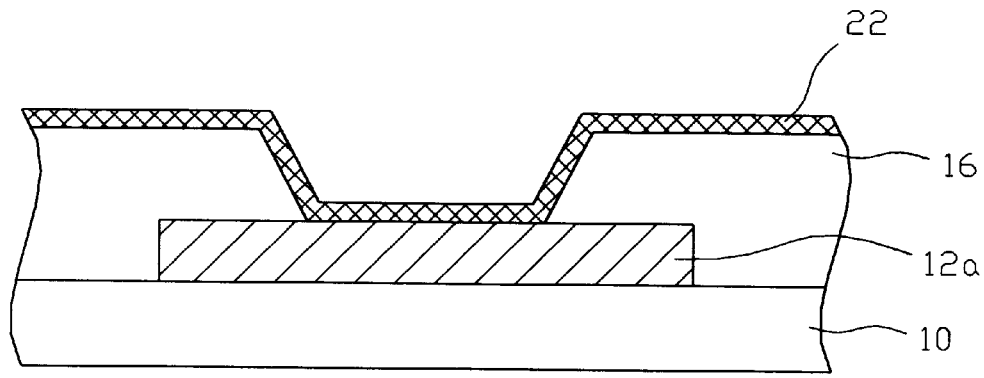
Figure 1H:
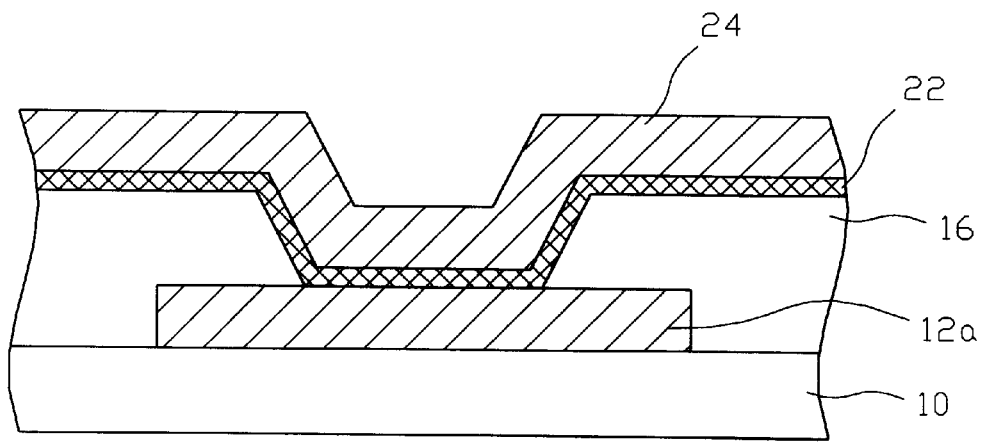
Figure 1I:
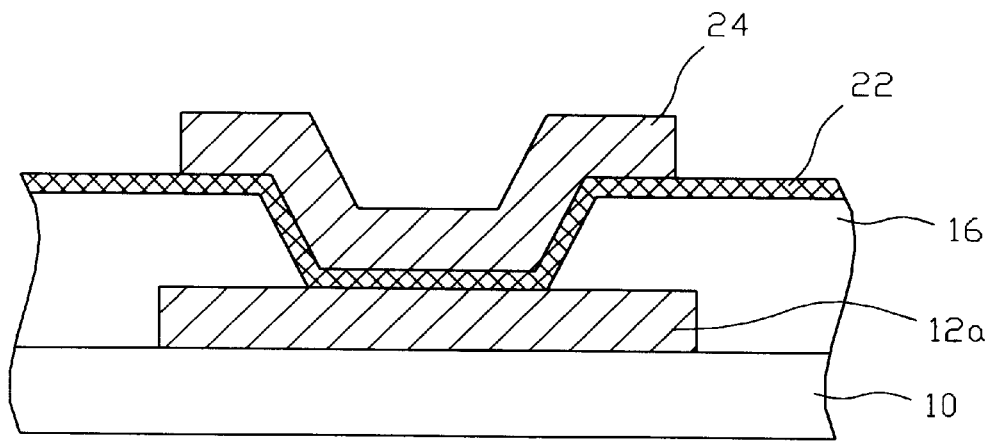
Figure 2:
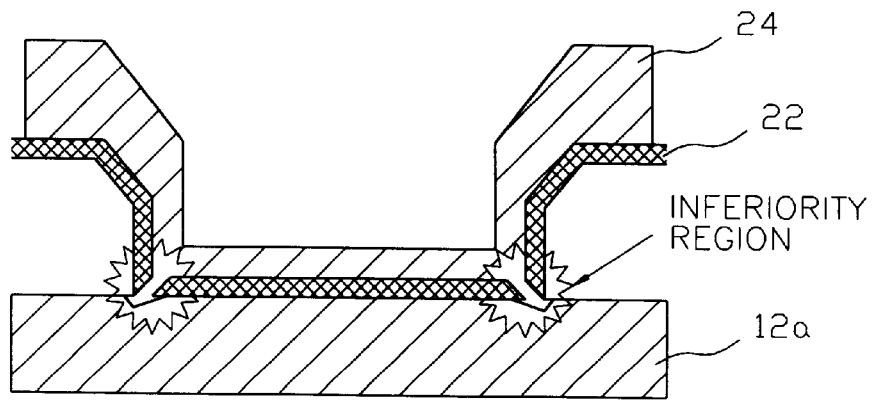
FIG. 2 is a cross-sectional view of an intermediate capacitor structure having a defective lower electrode, according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

FIGS. 3a to 3j are cross-sectional views of intermediate structures which illustrate a method of fabricating a thin film capacitor according to an embodiment of the present invention. First, referring to FIG. 3a, a field oxide layer 112 for defining an active region and a device isolation region, is formed on a semiconductor substrate 110 by a conventional LOCOS process. A lower structure (not illustrated) such as gate and source/drain regions may be formed on the active region. A first insulating layer 114 is then formed on the field oxide layer 112 and surface of the substrate 110, as illustrated. Thereafter, referring to FIG. 3b, a photoresist pattern 116 is formed on the first insulating layer 114, and then a photographic and etching process is performed using the photoresist pattern 116 as a mask, so that the first insulating layer 114 (on the upper region of the field oxide layer 112) is etched to a predetermined depth to define a trench 115 in which a capacitor is to be subsequently formed.

Figure 3A:
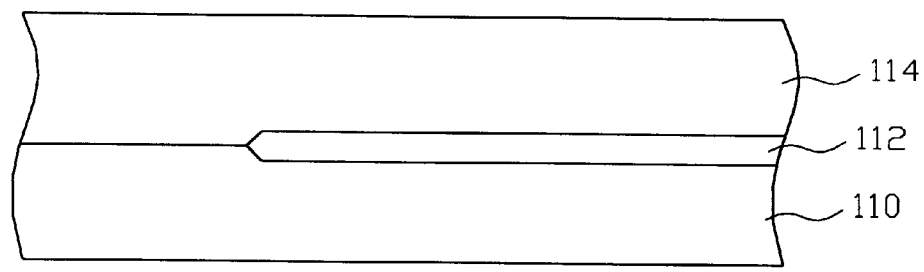
FIGS. 3a–3j are cross-sectional views of intermediate structures that illustrate methods of forming capacitors according to a preferred embodiment of the present invention.
Figure 3B:
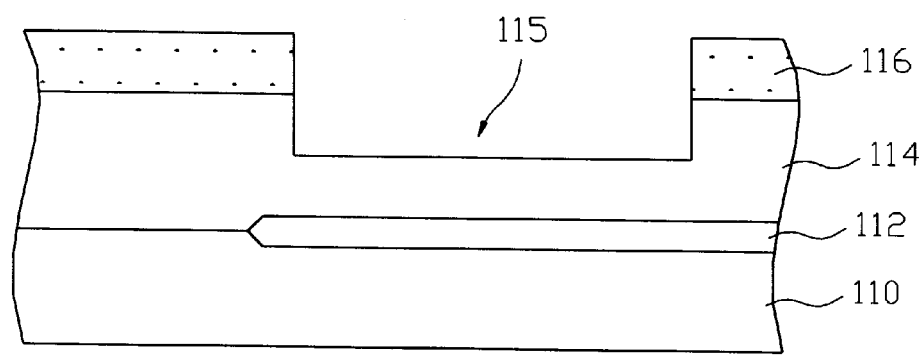
Figure 3C:
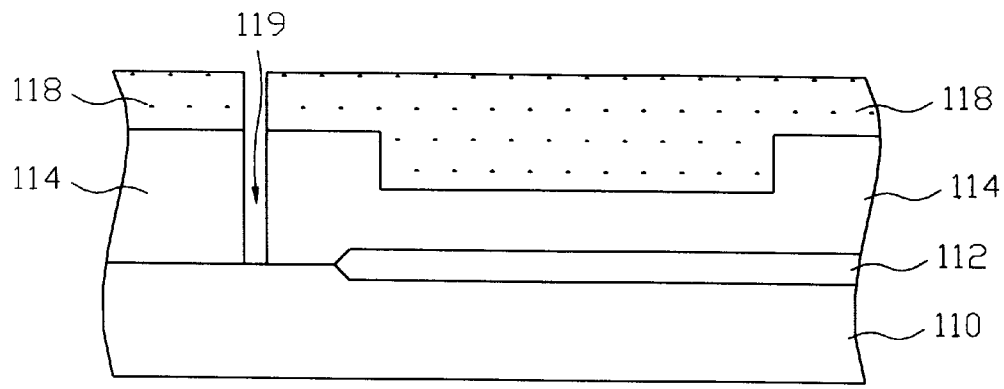

Referring to FIG. 3c, after the photoresist pattern 116 is removed, another photoresist pattern 118 is formed on the first insulating layer 114, and then a photographic and etching process is performed again using the photoresist pattern 118 as a mask so that a portion of the first insulating layer 114 extending opposite a portion of the active region is etched. This etching step is performed until the surface of the semiconductor substrate is exposed and a contact hole 119 is defined.

Figure 3D:
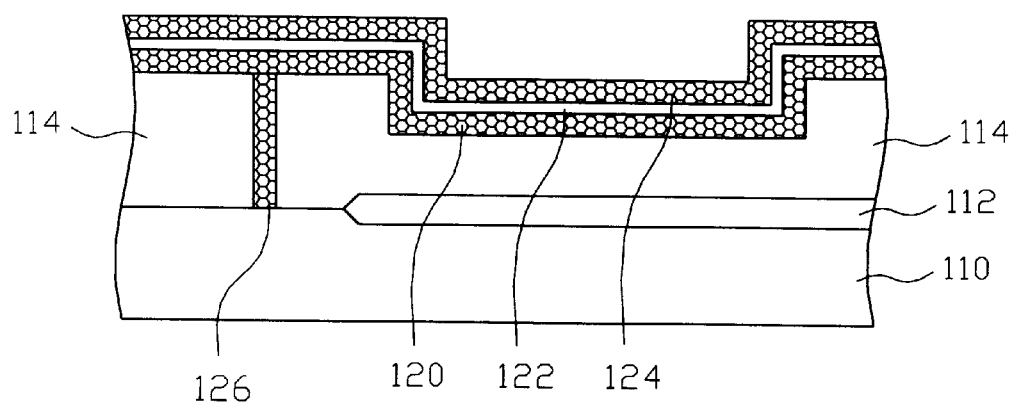

Referring to FIG. 3d, after the photoresist pattern 118 is removed, a lower capacitor electrode is formed by depositing tungsten (W) (which is a metal having a high melting point) on the surface of the first insulating layer 114. During this step, a first conductive plug 126 for filling the contact hole 119 is also formed. Thereafter, a dielectric layer 122 is formed as a high-temperature oxide layer or a high-temperature nitride layer, on the first conductive layer 120. A layer of tungsten (W) is then deposited again on the dielectric layer 122 to form a second conductive layer 124 for providing an upper capacitor electrode. At this time, since the lower capacitor electrode is formed using a high melting point metal such as tungsten (W), the dielectric layer 122 can be formed using a high temperature process step to improve the quality of the dielectric layer 122. For instance, the dielectric layer 122 may be formed by depositing $SiO_2$, SiN, or SiON as a single layer or a multilayer.

Figure 3E:
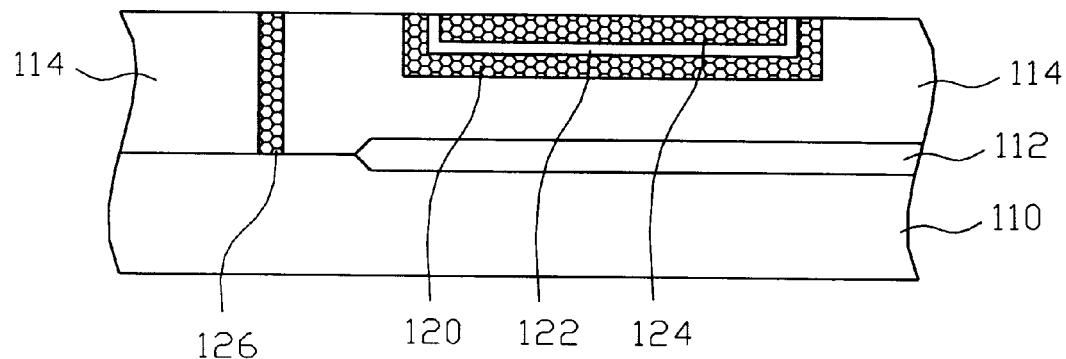

Referring to FIG. 3e, after the second conductive layer 124 is formed, the upper surface of the resultant structure is planarized by a CMP (chemical mechanical polishing) process. As a result of the planarization step, a capacitor which comprises a U-shaped first conductive layer 120, the second conductive layer 124, and the dielectric layer 122 is formed in the trench 115 shown in FIG. 3b. In addition, the conductive plug 126 is exposed.

Figure 3F:
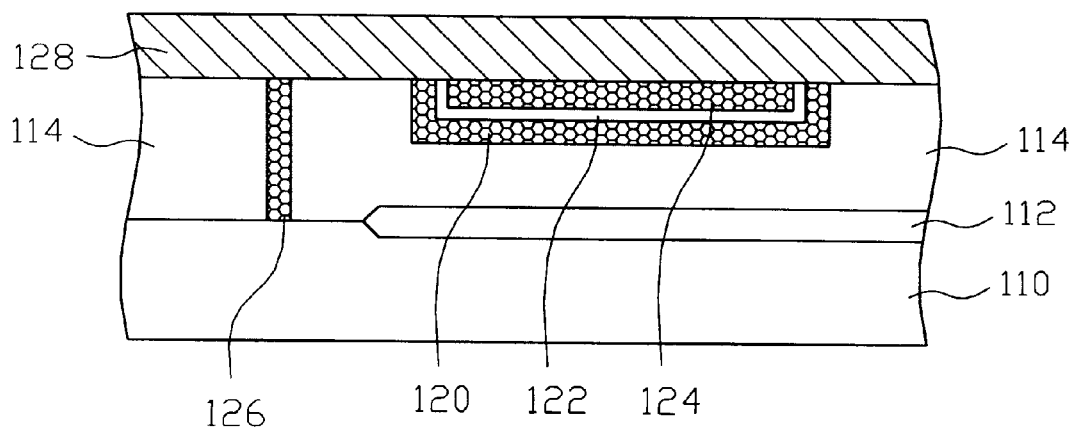
Figure 3G:
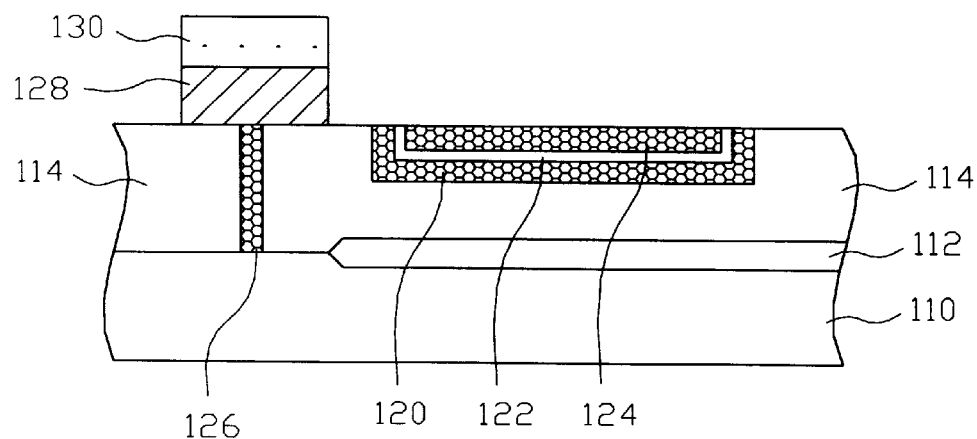

Thereafter, referring to FIGS. 3f and 3g, a first wiring layer 128 is formed by depositing a metal such as aluminum, aluminum alloy, etc., on the surface of the first insulating layer 114 and on the capacitor. A photoresist pattern 130 is then formed on the first wiring layer 128, and then a photographic and etching process is performed using the photoresist pattern 130 as a mask, until the upper surface of the first insulating layer 114 is exposed. As a result of etching, the first wiring layer 128 is defined in electrical contact with the plug 126.

Figure 3H:
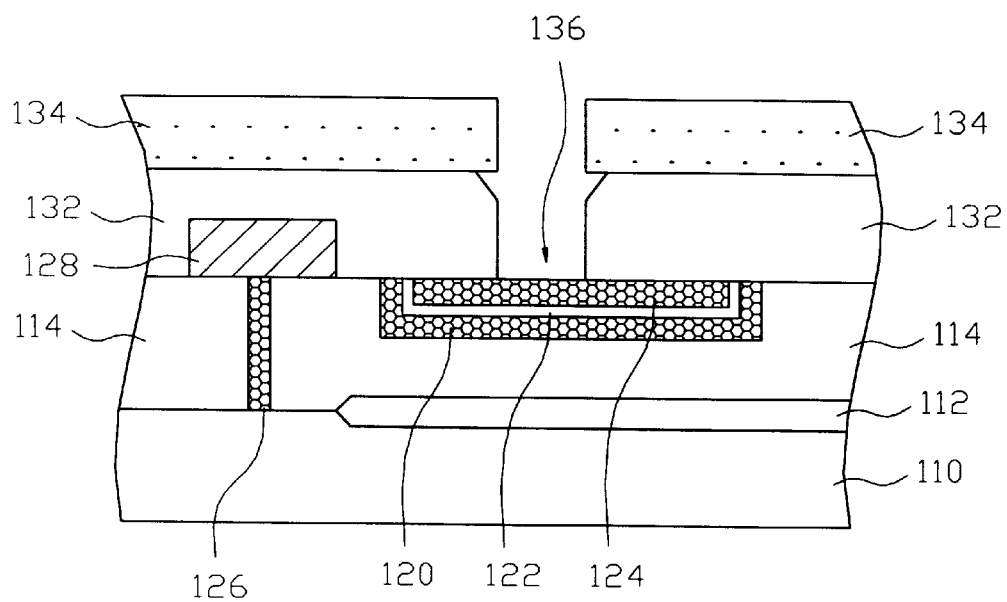

Referring to FIG. 3h, after the photoresist pattern 130 is removed, a second insulating layer 132 is formed on the surface of the resultant structure to electrically insulate the first wiring layer 128 from a subsequently formed second wiring layer 138. Thereafter, a photoresist pattern 134 is formed on the second insulating layer 132, and then a photographic and etching process is performed using the photoresist pattern 134 as a mask, until the upper surface of the second conductive layer 124 is exposed and a via hole 136 is defined.

Figure 3I:
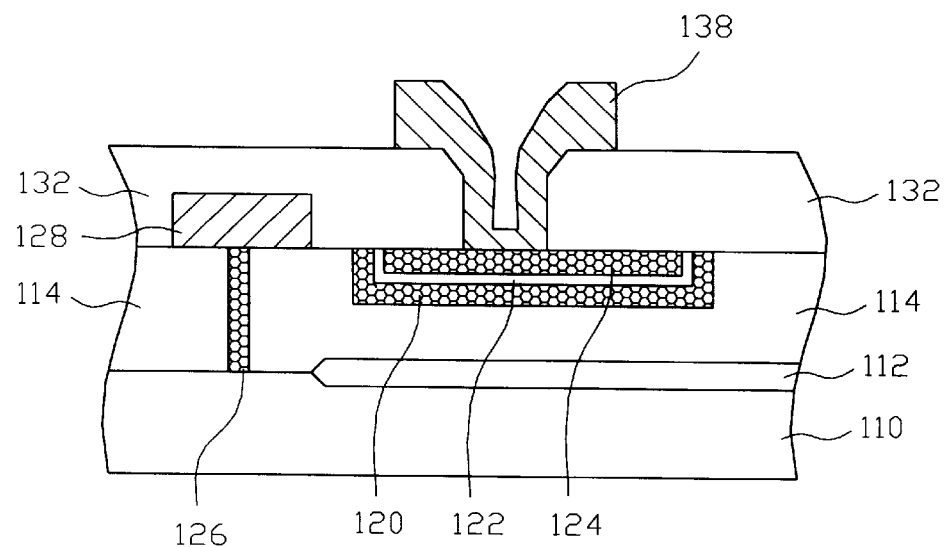
Figure 3J:
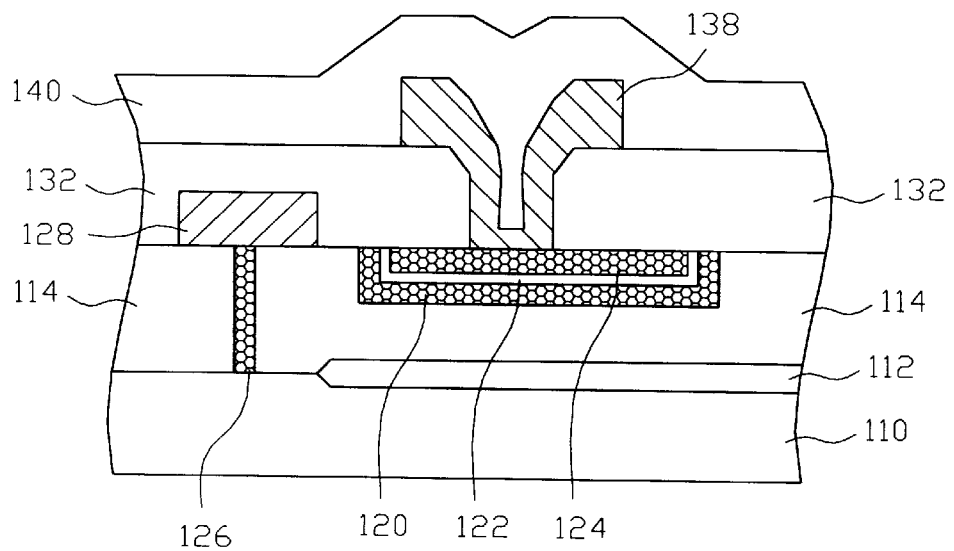

Referring now to FIG. 3i, after removal of the photoresist pattern 134, the second wiring layer 138 is formed on the surface of the second insulating layer 132 by depositing a metal such as aluminum, aluminum alloy, etc. Thereafter, as shown in FIG. 3j, a protective layer 140 is formed by depositing a nitride layer or a phosphosilicate glass (PSG) layer on the surface of the second insulating layer 132 and the second wiring layer 138.

Figure 4:
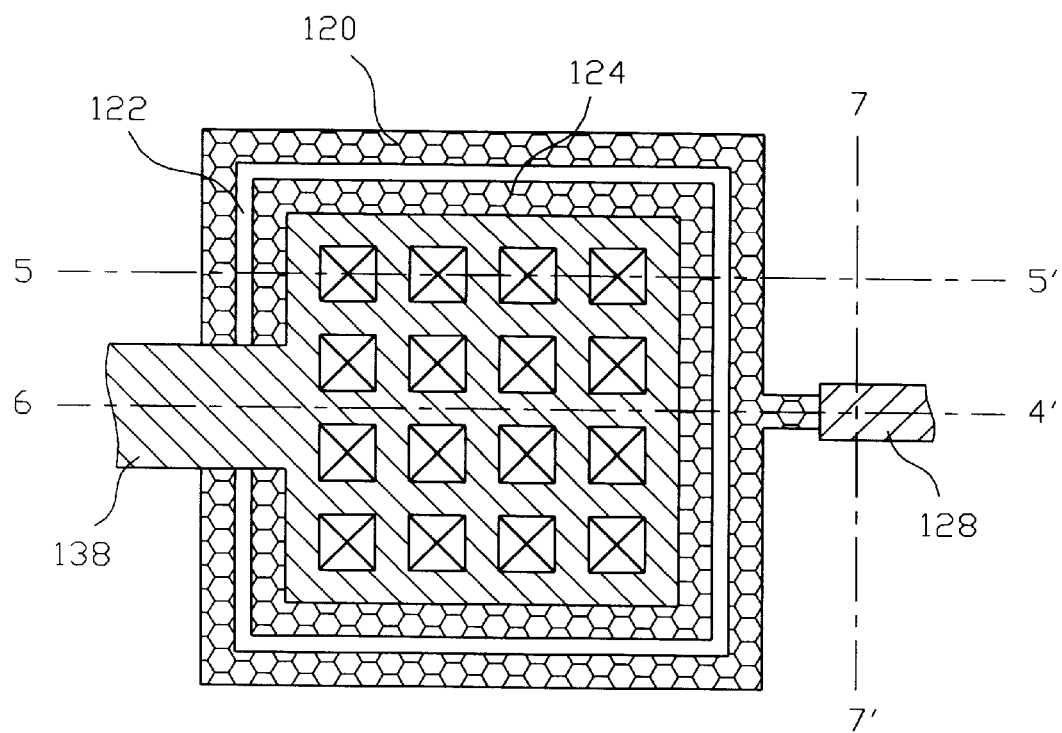
FIG. 4 is a layout schematic view of a capacitor structure formed using the methods of FIGS. 3a–3j.

FIG. 4, which is a plan layout view of the thin film capacitor according to the present invention, illustrates the capacitor provided with the first conductive layer 120, the dielectric layer 122 and the second conductive layer 124, and the connected state of the first and second wiring layers 128 and 138.

Figure 5:
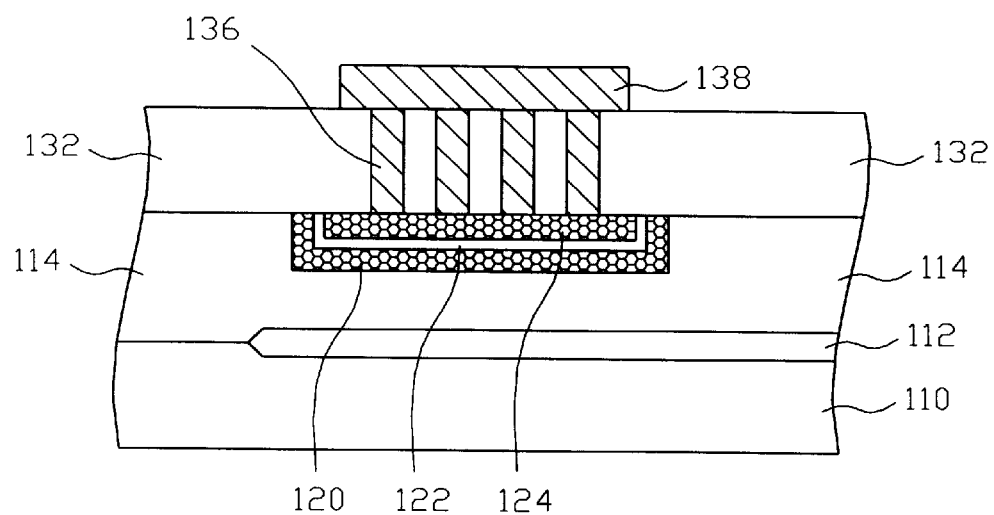
FIGS. 5–7 are cross-sectional views of the capacitor of FIG. 4, taken along liens 5–5', 6–6' and 7–7', respectively.
Figure 6:
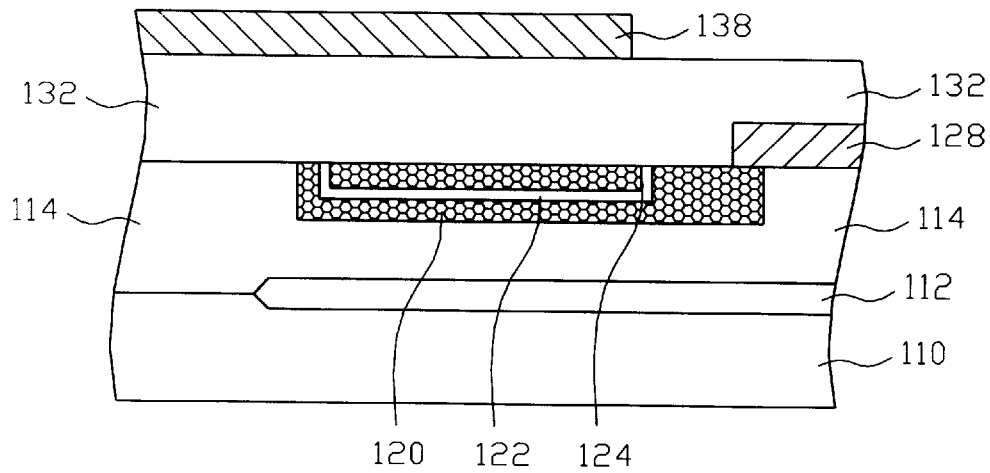
Figure 7:
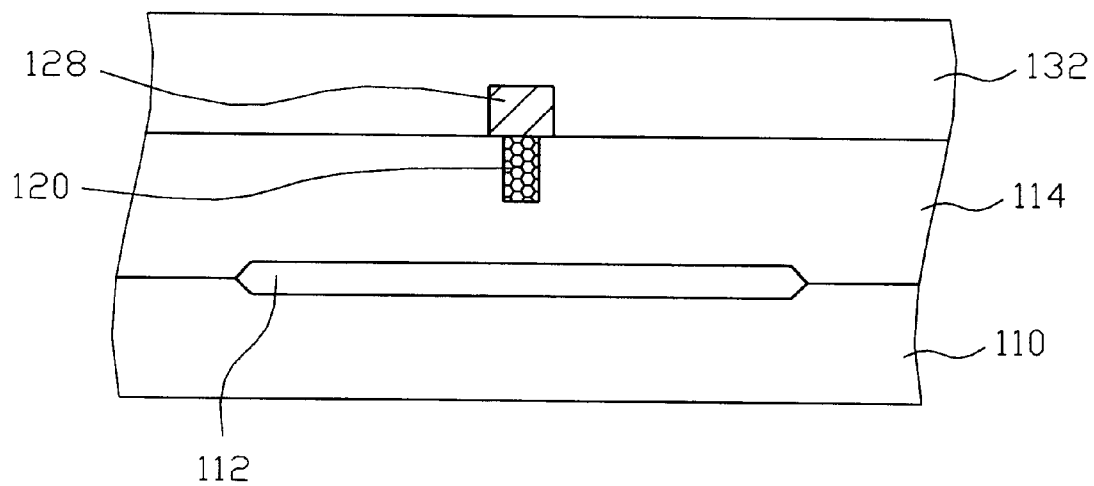

FIGS. 5–7 are sectional views of the capacitor of FIG. 4, taken along the lines 5–5', 6–6' and 7–7', respectively. As illustrated, the first wiring layer 128 is in contact with the first conductive layer 120, which forms the lower capacitor electrode, and the second wiring layer 138 is in contact with the second conductive layer 124, which forms the upper capacitor electrode, through the via holes 136.

Thus, according to the present invention, a lower capacitor electrode and an upper capacitor electrode can be simultaneously formed when forming a conductive plug in contact with a semiconductor substrate. In addition, since a metal having a high melting point can be used when forming the lower and upper capacitor electrodes, a dielectric layer can be formed on the lower capacitor electrode at a high temperature. Accordingly, the quality of the dielectric layer and its leakage current characteristic can be improved. Further, since the upper and lower electrodes are made of the same metal having a low resistance, capacitance variation due to voltage variation can be greatly reduced, and thus the thin film capacitor of the present invention can be used in precise analog semiconductor devices.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit capacitor, comprising the steps of:
    forming a first electrically insulating layer on a semiconductor substrate;
    forming a recess in the first electrically insulating layer;
    forming a contact hole which expose the semiconductor substrate, in the first electrically insulating layer;
    forming a first electrically conductive layer on a sidewall and bottom of the recess and in the contact hole;
    forming a dielectric layer on the first electrically conductive layer;
    forming a second electrically conductive layer, on the dielectric layer; opposite the first electrically conductive layer;
    planarizing the first and second electrically conductive layers simultaneously to define first and second capacitor electrodes in the recess and define a conductive plug in the contact hole that is electrically disconnected from the first capacitor electrode; and then
    forming a first wiring layer which electrically connects the conductive plug to the first capacitor electrode, on the first electrically insulating layer.

2. The method of claim 1, wherein said step of planarizing the first electrically conductive layer comprises planarizing the first electrically conductive layer to define a first electrode having a U-shaped cross-section.

3. The method of claim 2, wherein the first and second electrically conductive layers comprise tungsten.

4. The method of claim 2, wherein said planarizing step comprises planarizing the first and second electrically conductive layers and the dielectric layer using a chemical-mechanical polishing technique.

5. The method of claim 2, further comprising the steps of:
    forming a second electrically insulating layer on the first wiring layer and on the second electrode;
    patterning the second electrically insulating layer to expose a portion of the second electrode; and
    forming a second wiring layer electrically connected to the exposed portion of the second electrode.

6. The method of claim 5, wherein the dielectric layer comprises nitride; and wherein the first and second wiring layers comprise aluminum.

7. The method of claim 5, wherein the dielectric layer comprises a material selected from the group consisting of silicon dioxide, silicon nitride and silicon oxynitride.

8. A method of forming an integrated circuit capacitor, comprising the steps of:
    forming a first electrically insulating layer on a face of a semiconductor substrate;
    forming a first mask on the first electrically insulating layer;
    selectively etching the first electrically insulating layer to define a recess therein, using a first mask as an etching mask;
    forming a second mask on the first electrically insulating layer;
    selectively etching the first electrically insulating layer to define a contact hole therein which exposes the face of the semiconductor substrate, using the second mask as an etching mask;
    forming a first electrically conductive layer in the contact hole and in the recess;
    forming a dielectric layer on the first electrically conductive layer;
    forming a second electrically conductive layer on the dielectric layer, opposite the first electrically conductive layer;
    planarizing the first and second electrically conductive layers simultaneously to define first and second capacitor electrodes in the recess and define an electrically conductive plug in the contact hole that is electrically disconnected from the first capacitor electrode; and then
    forming a first wiring layer which electrically connects the electrically conductive plug to the first capacitor electrode, on the first electrically insulating layer.

9. The method of claim 8, wherein said step of planarizing the first electrically conductive layer comprises planarizing the first electrically conductive layer to define a first electrode having a U-shaped cross-section.

10. The method of claim 8, wherein the first and second electrically conductive layers comprise tungsten.

11. The method of claim 8, further comprising the steps of:
    forming a second electrically insulating layer on the first wiring layer and on the second electrode;
    patterning the second electrically insulating layer to expose a portion of the second electrode; and
    forming a second wiring layer electrically connected to the exposed portion of the second electrode.

12. The method of claim 11, wherein the dielectric layer comprises nitride; and wherein the first and second wiring layers comprise aluminum.

13. The method of claim 12, wherein the dielectric layer comprises a material selected from the group consisting of silicon dioxide, silicon nitride and silicon oxynitride.

14. The method of claim 13, wherein said planarizing step comprises planarizing the first and second electrically conductive layers and the dielectric layer using a chemical-mechanical polishing technique.

* * * * *